United States Patent [19]
Takiguchi

[11] Patent Number: 5,986,463
[45] Date of Patent: Nov. 16, 1999

[54] DIFFERENTIAL SIGNAL GENERATING CIRCUIT HAVING CURRENT SPIKE SUPPRESSING CIRCUIT

[75] Inventor: Tomio Takiguchi, Tokyo, Japan

[73] Assignee: NEC Corporation, Tokyo, Japan

[21] Appl. No.: 08/866,261

[22] Filed: May 30, 1997

[30] Foreign Application Priority Data

May 30, 1996 [JP] Japan ................................. 8-137151

[51] Int. Cl.[6] ........................ H03K 19/003; H03K 17/16
[52] U.S. Cl. ................................ 326/27; 326/83; 326/86
[58] Field of Search ................................ 326/17, 26, 27, 326/23, 83, 115, 121, 21, 86

[56] References Cited

U.S. PATENT DOCUMENTS

| | | | |
|---|---|---|---|
| 4,594,519 | 6/1986 | Ohtani et al. | 326/121 |
| 4,645,951 | 2/1987 | Uragami | 326/86 |
| 4,868,422 | 9/1989 | Daniele et al. | 326/17 |
| 5,264,744 | 11/1993 | Mizukami et al. | 326/21 |
| 5,391,939 | 2/1995 | Nonaka . | |
| 5,530,401 | 6/1996 | Cao et al. | 327/563 |
| 5,539,336 | 7/1996 | Nguyen et al. . | |
| 5,617,043 | 4/1997 | Han et al. | 326/83 |

FOREIGN PATENT DOCUMENTS

| | | |
|---|---|---|
| 62-214717 | 9/1987 | Japan . |
| 64-71325 | 3/1989 | Japan . |
| 1-293716 | 11/1989 | Japan . |
| 6-268487 | 9/1994 | Japan . |
| 7-177009 | 7/1995 | Japan . |
| 8-84057 | 3/1996 | Japan . |
| 8-223024 | 8/1996 | Japan . |
| 8-335881 | 12/1996 | Japan . |

OTHER PUBLICATIONS

H. Kohno et al., "A 350–MS/s 3.3–V 8–bit CMOS D/A Converter Using a Delayed Driving Scheme", *IEEE 1995 Custom Integrated Circuits Conference*, pp. 211–214.

*Primary Examiner*—Michael Tokar
*Assistant Examiner*—Don Phu Le
*Attorney, Agent, or Firm*—Sughrue, Mion, Zinn, Macpeak & Seas, PLLC

[57] ABSTRACT

The different signal generation circuit has a first transistor MP2 connected between a first power supply line Vcc and a first output terminal OTP and a gate connected to a first node, a second transistor MN2 connected between the first output terminal OTP and a second power supply line GND and a gate connected to a second node, and a delay circuit 31 and 13 connected between the first node and the second node.

11 Claims, 15 Drawing Sheets

DIFFERENTIAL SIGNAL GENERATING CIRCUIT HAVING CURRENT SPIKE SUPPRESSING CIRCUIT

BACKGROUND OF THE INVENTION

1. Field of the Invention

The present invention relates to a differential signal generating circuit, and more particularly, to a differential signal generating circuit having a current spike suppressing circuit for suppressing a current spike generated at current change-over of a differential switch and reduce the power consumption.

2. Description of the Prior Art

Heretofore, a differential signal generating circuit 16 as shown in FIG. 8(*a*) has been known as a differential signal generating circuit for driving a high speed differential switch by means of a CMOS circuit. This differential signal generating circuit 16 is interposed between a D type flip-flop (referred to as DFF hereinafter) 17 for taking synchronism with data, and a differential switch 18 comprising p-channel MOS transistors MP3, MP4, and MP5. The differential signal generating circuit 16 receives a positive phase input IN and generates mutually opposing positive and negative phase signals OTP and OTN.

The differential signal generating circuit 16 formed by inverters 22–24, 32, 42, and 43 in multistages is used as shown in FIG. 9(*a*). In this circuit, specific output signals are obtained by connecting the inverters 22, 24, 32, and 43 so as to form even-numbered stages on the side of the positive phase output OTP, and by connecting the inverters 22, 23, and 42 so as to form odd-numbered stages on the side of the negative phase output OTN. Here, the sizes of the inverters are chosen, by taking the size of the inverters 22–24 unity, to be 2 for the inverter 32, and 3 for the inverters 42 and 43. In addition, the channel width W and the channel length L of the transistor MP3 are taken to be 250 µm and 3 µm, respectively, and the channel width W of the transistors MP4 and MP5 is set to be 60 µm.

In order to obtain a differential switch operating at a higher speed, a DFF17A which generates a negative phase output ON as a data output in addition to the positive phase output Q, as shown in FIG. 8(*b*), may be used. A differential signal generating circuit 16A for using the negative phase output QN may be formed by inserting equivalent digital signal transmission circuits between the positive phase input IN and the positive phase output OTP, and between a negative phase input INN and the negative phase output OTN, respectively. For example, as shown in FIG. 9(*b*), the positive phase output OTP may be obtained by serially connecting the inverter 22 receiving the positive phase input IN and the inverter 42 driving the gate of the transistor MP4 of the differential switch 18, and the negative phase output OTN may be obtained by serially connecting the inverters 23 and 43.

The circuit of the DFF17 comprises p-channel MOS transistors MP31–MP34, n-channel MOS transistors MN31–MN34, and inverters 51, 52, 55, and 56, as shown in FIG. 10(*a*), forming a normally used CMOS D flip-flop. When a clock CK, positive relative to the level of a data signal input to a data input terminal D, changes from low level to high level (a clock with the level opposite to the positive phase clock CK is input to a negative phase clock terminal CKN), the DFF17 instantaneously fetches the signal level of data D and outputs the signal as a positive phase data Q. In the circuits in FIG. 10(*a*), and in FIG. 10(*b*) to be mentioned presently, the size of the inverters 51–52 is set to be 1.5, and that of the inverters 36 and 55–57 is set to be 0.75, by taking the size of the inverter 22 unity, and the channel width of the transistors is set to be 4 µm.

In the DFF17A in FIG. 8(*b*), for the positive phase data output Q and the negative phase data output QN, the configuration is so arranged as to generate equivalent output signals by suppressing the increase in the number of elements. The circuit of the DFF17A is formed by adding a latch part consisting of inverters 36, 53, and 57, p-channel MOS transistors MP35 and MP36, and n-channel MOS transistors MN35 and MN36, to the output of the inverter 51, as shown in FIG. 10(*b*).

The differential switch 18 comprises a p-channel MOS transistor MP3 which is a constant current source, and p-channel MOS transistors MP4 and MP5 for switching the current. The transistors MP4 and MP5 are connected to the positive phase output OTP and the negative phase output OTN, respectively, of the differential signal generating circuit 16 so as to let a current flow in the transistor MP4 or MP5 to which is input the signal with the lower level of the two outputs.

In order to suppress the current spike at a current output terminal IO or ION through adjustment of the rise and fall times of the positive phase output OTP and the negative phase output OTN of the differential signal generating circuit 16 supplied to the differential switch 18, a circuit as shown in FIG. 9(*c*) is also employed. This circuit is disclosed in the Digest Paper No. 10.5, 1 entitled "A 350-MS/S 3.3-V 8-bit CMOS D/A Converter Using a Delayed Driving Scheme" of the 1995 Custom Integrated Circuits Conference (CICC).

The circuit in FIG. 9(*c*) uses similar component elements as in the circuit in FIG. 9(*b*), but the gate electrodes of p- and n-channel MOS transistors MP21, MP22 and MN21, MN22 are arranged to be driven by mutually different signals. Namely, the gate electrodes of the transistors MP21 and MP22 are connected to the outputs of the inverters 22 and 23, respectively, and the gate electrodes of the transistors MN21 and MN22 are connected to the inputs INN and IN, respectively, which are opposite in phase to the outputs of the transistors MN21 and MN22. As a result of such a connection, the signals of the p-channel MOS transistors MP21 and MP22 are delayed by an amount corresponding to one stage component of the inverter relative to the signals of the n-channel MOS transistors MN21 and MN22.

The circuit of the prior art differential signal generating circuits described above will be explained using the result of verification of transient analysis of the circuit operation by appropriately setting the sizes of respective transistors. What is meant by the size of the transistor is the channel width W, and the channel length L means the minimum producible length of the transistor. Further, the sizes of the inverters are set to be 2 for the inverter 32, 3 for the inverters 42 and 43, 1.5 for the inverters 51–53, and 0.75 for the inverters 36 and 55–57.

When the differential switch 18 in FIG. 8(*a*) is switched at a high frequency of several hundreds of MHz, sometimes there occur a nonconductive state, though momentarily, in the operation of the transistors MP4 and MP5, and as a result, a current spike is generated in the current output terminal IO or ION. This current spike has a drawback in that when the current path in either one of the transistors MP4 and MP5 is switched to the other current path, it prolongs the settling time before the current generated at the current output terminal IO or ION attain a stationary condition, obstructing the differential switching operation at high speed.

In other words, if the MOS transistors MP4 and MP5 are turned on simultaneously in the differential switch 18, the drain voltage of the transistor MP3 is raised and charge is accumulated in the portion connected to the drain. When either of the transistors MP4 or MP5 is turned off in this state, the accumulated charge is suddenly discharged and produces a spike at its output terminal IO or ION. Consequently, it takes time before the current settles stably in a stationary state, which gives rise to a problem that it obstructs the high speed operation of current switching of the differential switch.

The above problem will be described in more detail in the following.

First, the various transistors are set so as to give a normal threshold voltage which is ½ of a power supply voltage 3.3 V for the sizes of the inverters of the differential signal generating circuit 16 in FIG. 9(a). The result of verification of transient analysis when clocks and data as shown in FIGS. 11(a) and 11(b) are input for the combination of the circuit 16 having these inverters and the DFF17 in FIG. 10(a) as in FIG. 8(a), is shown by H of the positive phase output OTP and J of the negative phase output OTN in FIG. 12(a). From the figure it can be seen that the intersection P of the voltage waveforms at approximately the time 30 ns is about 2.8 V. In other words, since the gate potentials of both transistors MP4 and MP5 have values near the power supply voltage 3.3 V, both transistors are in states close to deenergized state, so a current spike L as shown in FIG. 14(a) is generated at the current output terminal IO.

The reason for this is the difference in the number of stages of the inverters in FIG. 9(a), namely, the positive phase output OTP side has one more stage of the inverter 24 than the OTN side, gaining more delay corresponding to this component, and tends to cause the voltage intersection P to be generated at a position closer to the power supply voltage side. That the gate voltages of the transistors of the differential switch are high means that the rise of the voltage waveforms is fast and their fall is slow. That is, owing to the fact that both transistors are of p-channel type, they are turned off soon if the rise is fast, and are turned on late if the fall is slow. In other words, both transistors are likely to be turned off simultaneously, and in the opposite case, the time for both transistors to remain turned on becomes long.

Even when the channel width W of the p-channel MOS transistor is made to be 14 μm equal to the channel width W of the n-channel MOS transistor for the purpose of improving on this point, the intersection P of the positive and negative phase voltage outputs at 30 ns is reduced by only about 1.5 V, as shown in FIG. 12(b), and gives rise to a current spike L as indicated in FIG. 14(b).

Further, in order to reduce the size of the current spike L, a drive circuit may be configured as in FIG. 8(b) where the positive and negative phase signal paths are formed equivalently by using a DFF17A as in FIG. 10(b) for obtaining both of positive and negative phase outputs and a differential signal generating circuit 16A as shown in FIG. 9(b). In these circuits, the channel width W of each of the p- and n-channel MOS transistors in FIG. 9(b) is set to be 14 μm in order to slow down the rise and hasten the fall of the inverters 22 and 23. This is arranged so as to make the three times the area of the inverter of reference size equal to the total sum of the gate areas of the MOS transistors. In addition, the values of W and L of the transistors in the other figures are set to be the same as before if their symbols are identical.

The simulation result of the verification of transient analysis using this circuit is shown in FIG. 13(a). Although the intersections R and P of the positive phase output OTP and the negative phase output OTN which arise at about the times 25 and 30 ns, respectively, show an improvement, the size of the current spike L at the current output terminal IO shown in FIG. 15(a) has a large value as in FIG. 14(b).

When the circuit in FIG. 9(c) instead of that in FIG. 9(b) is used as a mean for improving the current spike, the result of simulation of the transient analysis verification of the circuit where the channel width W of the p- and n-channel MOS transistors MP21, MP22 and MN21, MN22 is set to be 14 μm is shown in FIG. 13(b). In this case, it is possible to reduce the waveform intersections R and P, where the positive and negative phase outputs OTP and OTN cross each other at about 25 and 30 ns, respectively, to about 0.5 V, and make the current spike L at the current output terminal IO small as in FIG. 15(b).

However, in this circuit the signals in the p-channel MOS transistors MP21 and MP22 are delayed than the signals in the n-channel MOS transistors MN21 and MN22 by the amounts corresponding to the inverters 22 and 23. Accordingly, when the gate input signals are inverted, there arises a state in which both of the p- and n-channel MOS transistors MP21, MP22 and MN21, MN22 find themselves in the energized state. Because of this, there is a problem in that the through current gets very large, and the number of elements of the DFF in FIG. 10(b) is increased, so that there are more defects than in the aforementioned circuit (the circuit in FIG. 8(a) using the circuits in FIG. 9(a) and FIG. 10(a)).

The simulation result of the transient analysis verification of these circuit is shown in FIGS. 16(a) and 16(b). Namely, for the circuit in FIG. 8(a) using the circuits in FIG. 9(a) and FIG. 10(a), the changes in the current consumption are represented by the peak current 3.95 mA and the mean current 238 μA as shown in FIG. 16(a). For the circuit in FIG. 8(b) using the circuits in FIG. 9(c) and FIG. 10(b), the changes in the current consumption are represented by the peak current 6.11 mA and the mean current 354 μA.

SUMMARY OF THE INVENTION

It is therefore the object of the present invention to provide a differential signal generation circuit which makes a high speed switching operation, low power consumption and very small current spike by driving to prevent a pair of differential transistor from a simultaneous inactivation.

To achieve the above object, the present invention has a differential signal generating circuit outputting a pair of differential signals, in response to a control signal, for switching the current path of a switching circuit comprising a pair of differential transistors, said differential signal generating circuit further comprising an output delay circuit driving said pair of differential transistors to prevent said pair of differential transistors from a simultaneous inactivation by giving a longer delay to a fall time of one of said pair of differential signals than to a rise time of said control signal, or by giving a longer delay to a rise time of one of said pair of differential signals than to a fall time of said control signal.

As a result, a pair of differential signals are crossing a low voltage portion, therefore, a power consumption of the differential signal generation circuit decreases and the current spike also decreases.

This differential signal generating circuit comprises an inverter circuit which inverts a control signal and outputs it as one of differential signals, and a pseudo inverter which carries out a first and a second pseudo inversion by inputting the control signal and inputs the inverted control signal to carry out the second pseudo inversion and outputs the other noninverted signal, where this pseudo inverter comprises a circuit which employs a first p-channel and an n-channel MOS transistors, using their commonly connected gates as an input terminal and their commonly connected drains as an output terminal, for the first pseudo inversion, and employs a second p-channel and an n-channel MOS transistors, using their commonly connected gates as an input terminal and their commonly connected drains connected to the output of the first pseudo inversion as an output terminal, for the second pseudo inversion, with the sources of respective p-channel MOS transistors connected to a power terminal, the source of the second n-channel MOS transistor connected to the ground, and the source of the first n-channel MOS transistor connected to the common drains of the second p-channel and n-channel MOS transistors.

Further, the pseudo inverter of this invention may be formed of a circuit obtained by connecting the drain of the first p-channel MOS transistor to a power terminal, grounding the sources of respective n-channel MOS transistors, and connecting the source of the first p-channel MOS transistor to the common drain of the second p-channel and n-channel MOS transistors, or the pseudo inverter may be comprised of a first pseudo inverter which carries out the first and second inversions by inputting the control signal and carries out the second pseudo inversion the control signal and inputting the inverted control signal and outputs the noninverted differential signal, and a second pseudo inverter which inputs the inverted control signal and carries out the first and second pseudo inversion and inputs the control signal and carries out the second pseudo inversion and outputs the other differential signal which is not inverted.

BRIEF DESCRIPTION OF THE DRAWINGS

The above and other objects, advantages, and features of the present invention will be more apparent from the following description taken in conjunction with the accompanying drawings, in which:

FIG. 2 is smaller than the threshold of the transistor MN1;

DESCRIPTION OF THE PREFERRED EMBODIMENTS

Figure 1:
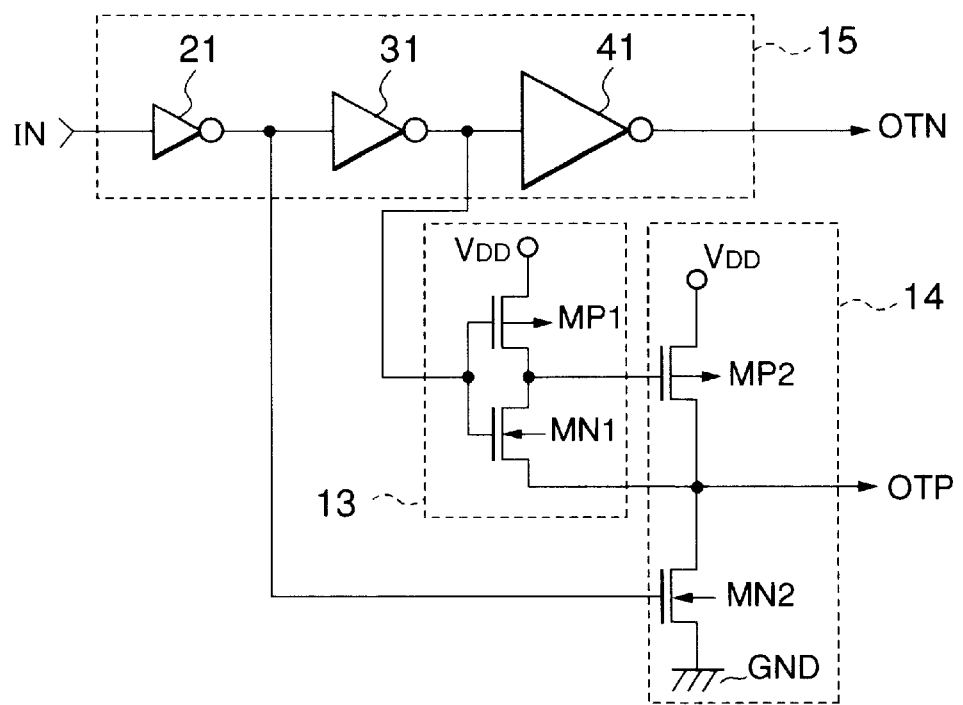
FIG. 1 is a circuit diagram illustrating a first embodiment of the differential signal generating circuit of the invention.

Referring to the drawings, the present invention will be described in the following. FIG. 1 is a block diagram of an embodiment of this invention, which to be formed on a p-type semiconductor substrate. This differential signal generating circuit 16 is also applicable to the circuit shown in FIG. 8. Namely, the drive circuit of interest comprises a DFF17 having data input DATA, a differential signal generating circuit 16 connected to the DFF17, and a differential switch 18 connected to the circuit 16.

This differential signal generating circuit 16 receives a positive phase data output Q of the DFF17 as the positive phase input IN, and instantaneously outputs corresponding positive and negative phase signals as a positive phase output OTP and a negative phase output OTN. This differential signal generating circuit 16 in FIG. 1 is comprises an inverter circuit group 15, a first pseudo inverter 13, and a second pseudo inverter 14.

The inverter circuit group 15 is composed of three inverters 21, 31, and 41 connected in series of three stages, where the input to the inverter 21 is identified as a positive phase input IN and the output of the inverter 41 is identified as a negative phase output OTN. The first pseudo inverter 13 comprises a p- and an n-channel MOS transistors MP1 and MN1. Their source electrodes are connected respectively to a power supply terminal VDD and the output (OTP) of the second pseudo inverter 14, and their gate electrodes are connected in common and is connected to the output of the inverter 31 which serves as the input to the first pseudo inverter 13. Their drain electrodes are also connected in common and is connected to the input of the second pseudo inverter 14 as the output of the first pseudo inverter 13.

The second pseudo inverter 14 is composed of a p-channel MOS transistor MP2 whose gate and source electrodes are connected to the output of the first pseudo inverter 13 and the power terminal VDD, respectively, and an n-channel MOS transistor MN2 whose gate and source electrodes are connected to the output of the inverter 21 and a ground terminal GND, respectively. The remaining drain electrodes of the transistors MP2 and MN2 are connected in common and serves as the positive phase output OTP of the differential signal generating circuit 16.

As to the operation of this differential signal generating circuit 16, the signal path from the positive phase input IN to the negative phase output OTN is the normal three stage coupling of the inverters 21, 31, and 41, so a signal level opposite to the signal level of the positive phase input IN is output to the opposite phase output terminal OTN. On the other hand, the signal path from the positive phase input IN to the positive phase output OTP needs be described for the three cases in which a low level signal is input to the positive phase input terminal IN, the signal level is changed from this state to high level, and the signal level is changed from high level to low level.

First, when a low level signal is input to the positive phase input IN, the output of the inverter 21 goes to high level, so the transistor MN2, of the second pseudo inverter 14, which receives the output of the inverter 21 to the gate electrode is energized. Since the first pseudo inverter 13 receives the output of the inverter 31, its input is at a low level, and the transistor MP1 is energized and the transistor MN1 is deenergized. Because of this, the first pseudo inverter 13 outputs a high level signal with potential close to that of the power terminal VDD. Since this output is input to the gate electrode of the transistor MP2 of the second pseudo inverter 14, the transistor MP2 is deenergized. Accordingly, the transistor MN2 is energized and the transistor MP2 is deenergized, so a low level signal with potential close to that of the ground terminal is output to the positive phase output terminal OTP.

Next, when the level of the signal at the positive phase input terminal IN changes to high, the output of the inverter 21 changes to low level, so the transistor MN2, of the second pseudo inverter 14, which receives this signal is deenergized. In the first pseudo inverter 13, the transistor MP1 is deenergized and the transistor MN1 is energized. At this time, the transistor MP2 of the second pseudo inverter 14 is in a state where its gate electrode and the drain electrode are almost short-circuit.

Now, the change in the potential of the common drain electrodes of the transistors MP1 and MN1 which is the output of the first pseudo inverter 13 is determined by the relative magnitude of the parasitic capacitance associated with the drain and the parasitic capacitance of the node of the source electrode of the transistor MN1. Normally, however, the latter parasitic capacitance which corresponds to the signal output stage of the differential signal generating circuit 16 is larger than the former. Consequently, the potential at the junction of the drain electrodes of the transistors MP1 and MN1 is drawn in toward the potential of the node of the source electrode of the transistor MN1. The potential at the node of the source electrode of the transistor MN1 has been at low level, so the potential of the junction of the drain electrode of the transistor MN1 is also on the low level side. Since this junction is also connected to the gate electrode of the transistor MP2 of the second pseudo inverter 14, the transistor MP2 goes from the deenergized state to the energize state. As a result, the signal level of the positive phase output OTP transits to the high level side with the transistors MP2 and MN2 going to the energized and deenergized states, respectively Since, however, the gate and drain electrodes of the transistor MP2 go to almost short-circuited state at this time as mentioned above, the potential of its gate electrode is raised toward the high level side.

This gives rise to the negative feedback effect in which the transistor MP2 is always made to operate in the saturated region with high output resistance, and drops the slew rate by raising the output resistance in proportion to the rise in the potential of the positive phase output OTP. The reason for this is clear from the fact that, when a short-circuit occurs between the gate and drain electrodes, the resistance rds[MP2] between the drain and the source of the transistor MP2 is given by the following expression:

$$rds[MP2]=1/\{Kp(W/L)(VDD-V[OTP]Vth[MP2])\},$$

where Kp is the transconductance of the transistor MP2 determined by the capacitance per unit area of the silicon oxide film and the hole mobility, W/L is the ratio of the channel width to the channel length of the transistor MP2, VDD is the power terminal potential, V[OTP] is the potential of the positive phase output, and Vth[MP2] is the absolute value of the threshold of the transistor MP2.

According to this expression, rds[MP2] goes to infinity when the potential V[OTP] of the positive phase output OTP becomes equal to VDD-Vth[MP2], and the potential of the positive phase output OTP will not be raised beyond the potential VDD-Vth[MP2]. In other words, the potential of the OTP will never become equal to the potential VDD of the power terminal.

The above conclusion is valid on the condition that the transistor MN1 of the first pseudo inverter 13 will never go to the deenergized state for ever. In the present embodiment, however, the potential of the source electrode of the transistor MN1 is equal to V[OTP]. Since the potential V[OTP] changes toward the high level side, it causes the voltage Vgs[MN1] between the gate and the source of the transistor MN1 to decrease, and it is conceivable to have a state in which the voltage Vgs[MN1] goes to below the threshold Vth[MN1] of the transistor MN1 in which case the transistor MN1 goes to the deenergized state. The condition for the potential V[OTP]which causes the transistor MN1 to go to the deenergized state is that it is higher than VDD[MN1].

In other words, if VDD-Vth[MN1] is smaller than VDD-Vth[MP2] and VTH[MN1] is greater than Vth[MP2], then the transistor MN1 goes to the deenergized state sooner than the transistor MP2 does, so the rise in the gate electrode potential of the transistor MP2 will be stopped at this potential. This means that the gate-source voltage of the transistor MP2 does not go to below VTH[MP2], and the transistor MP2 will be in the energized state for all times. If the transistor MP2 is energized, it operates in the unsaturated region when its drain current goes to a minimum, and its drain-source voltage becomes close to zero. This means that the high level signal of the positive phase output OTP rises up to the potential of the power terminal.

In a normal CMOS digital circuit, the thresholds of the p- and n-channel MOS transistors are often such that VTH[MN1] is small than Vth[MP2]. This result presupposes that the potentials of the back gate and the source electrode are identical. However, in the present embodiment, the potential of the back gate of the transistor MN1 is equal to the ground potential which is the potential of the p-type substrate, while the potential of the source electrode is equal to the potential of the positive phase output OTP. Moreover, the positive phase output OTP in this state takes on a value close to the power supply potential. This indicates that the rise in the threshold caused by the difference between the potentials of the source electrode and the back gate potential is large, which induces that Vth[MN1] to be larger than Vth[MP2]. To summarize the above, when a high level signal is input to the positive phase input terminal IN, there arise two cases, namely, one is the case in which a value close to VDD is output as a high level signal at the positive phase output terminal OTP, and the other is the case in which the high level signal at the positive phase output terminal OTP is equal to VDD-V[OTP]. Which of the two cases occur is determined by the relative magnitude of the threshold of the transistors MP2 and MN1, and the former situation of outputting a high level signal is often the case.

Next, the signal change at the positive phase output terminal OTP which occurs when the input signal at the positive phase input terminal IN is changed from high level to low level will be described. The state of the potentials of the gate and the source of the transistor MP2 immediately before this change in the signal level is a state in which they are close to the thresholds Vth[MP2] and Vth[MN1] of the transistors MP2 and MN1. As a result of the change from this state to the state where the positive phase input IN is at low level, the transistor MP1 is energized and the transistor MN1 is deenergized, so the gate electrode potential of the transistor MP2 is changed to a potential near the power supply voltage VDD, and the transistor MP2 is brought to the deenergized state.

On the other hand, since the input to the gate electrode of the transistor MN2 is the output of the inverter 21 situated immediately following the positive phase input IN, as soon as the positive phase input IN changes from high level to low level, the transistor MN2 changes quickly from the deenergized state to the energized state under the signal inversion action of the inverter 21. Since the signal delay of the positive phase output OTP is mediated by the two stages of the inverter 21 and the transistor MN2, in contrast to the delay of the negative phase output OTN mediated by the three stages of the inverters 21, 31, and 41, the signal change of the positive phase output OTP is considered to take place rapidly.

From what has been said in the above, the transistors MP2 and MN1 go to the deenergized and energized states, respectively, and the positive phase output OTP goes from high level to low level. What is to be noted here is that the gate-source voltage of the transistor MP2 is already at a value close to the threshold prior to its going to the deenergized state, owing to the change in the positive phase input IN, which means that the capability of supplying power from the power supply source to the drain electrode is already weakened considerably. In other words, even if both transistors MP2 and MN1 are energized momentarily at the instant when the positive phase output OTP makes transition from high level to low level, the intensity of the through current, which arises in the normal inverters 21, 31, and 41 is very small. This is considered to make the signal fall time of the positive phase output OTP very small, and diminish the mean value and the peak value of the current consumption of the differential signal generating circuit 16.

In this way, speaking of the positive and negative phase outputs OTP and OTN generated corresponding to the positive phase input IN, the positive phase output OTP has a longer rise time and a shorter fall time compared with the negative phase output OTN. As a result, the voltage intersections where the potential levels of both outputs become equal occur on the low potential side.

Figure 8A:
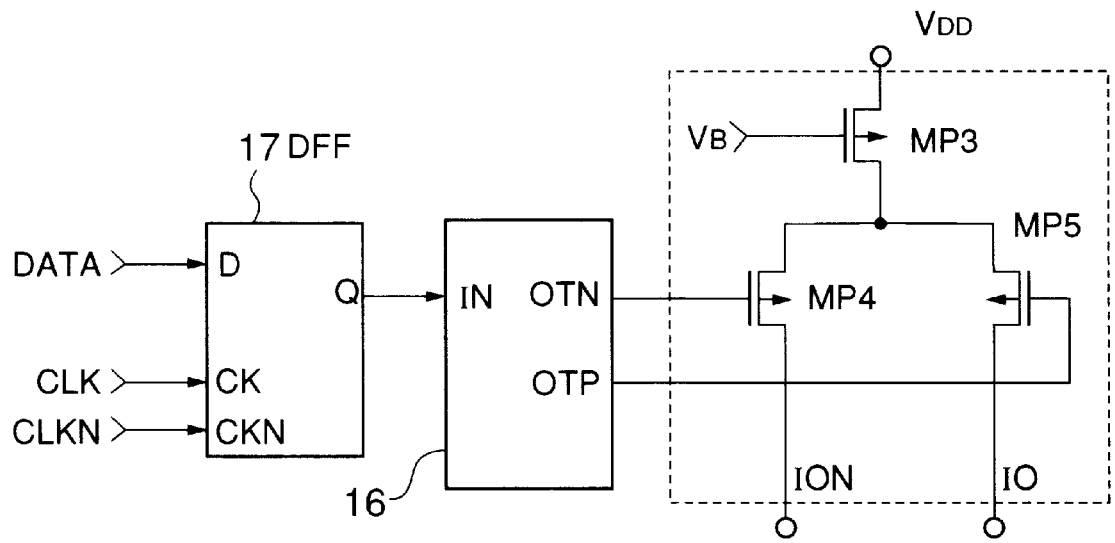
FIG. 8 shows block diagrams of a circuit driving the conventional differential switch 18.
Figure 8B:
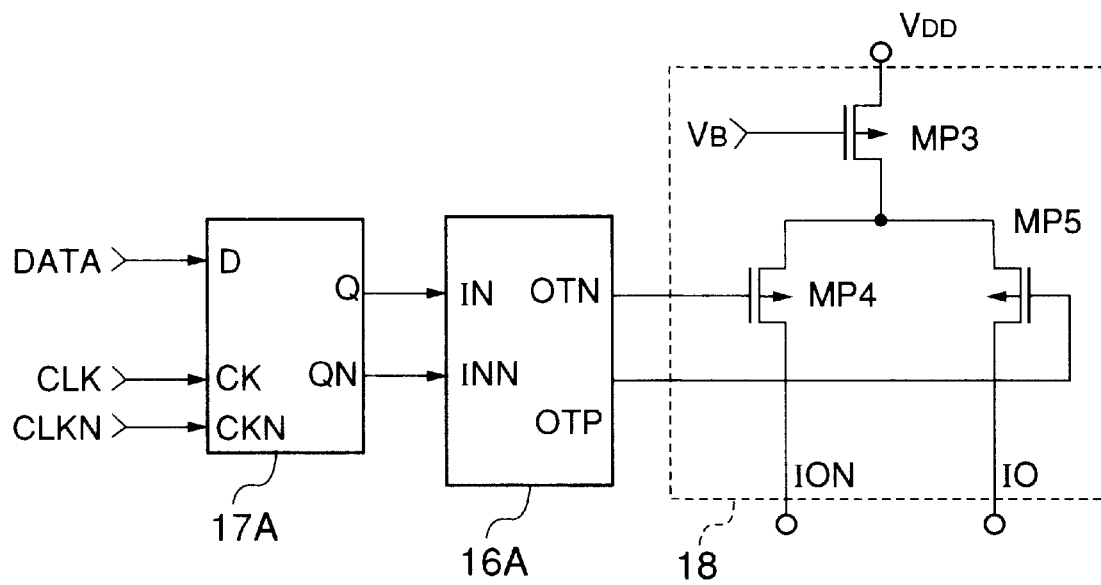
Figure 9A:
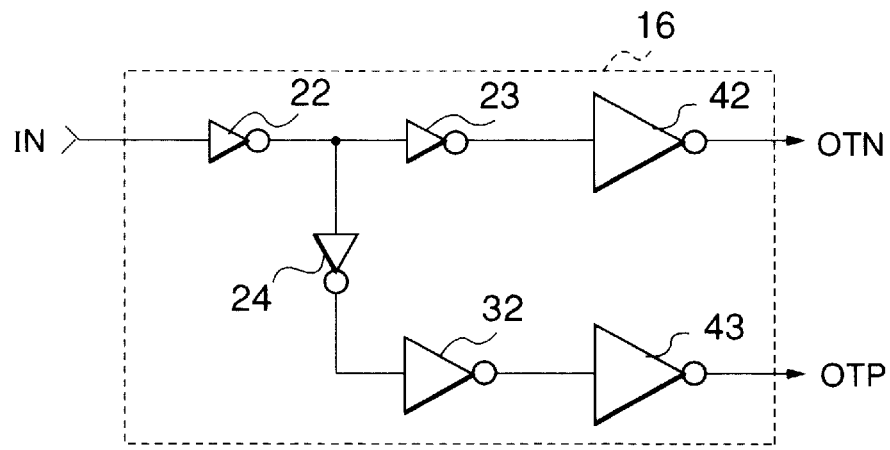
FIG. 9 shows circuit diagrams illustrating three examples of the differential signal generating circuit 16 driving the conventional differential switch.
Figure 9B:
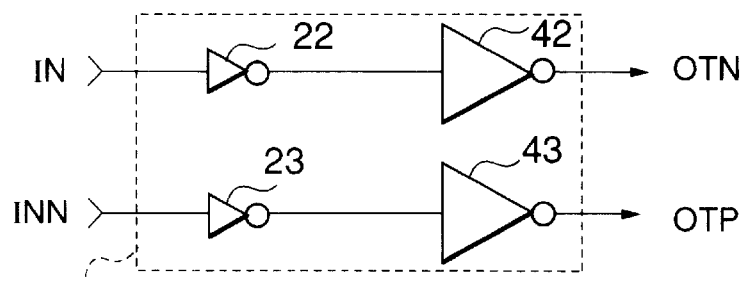
Figure 9C:
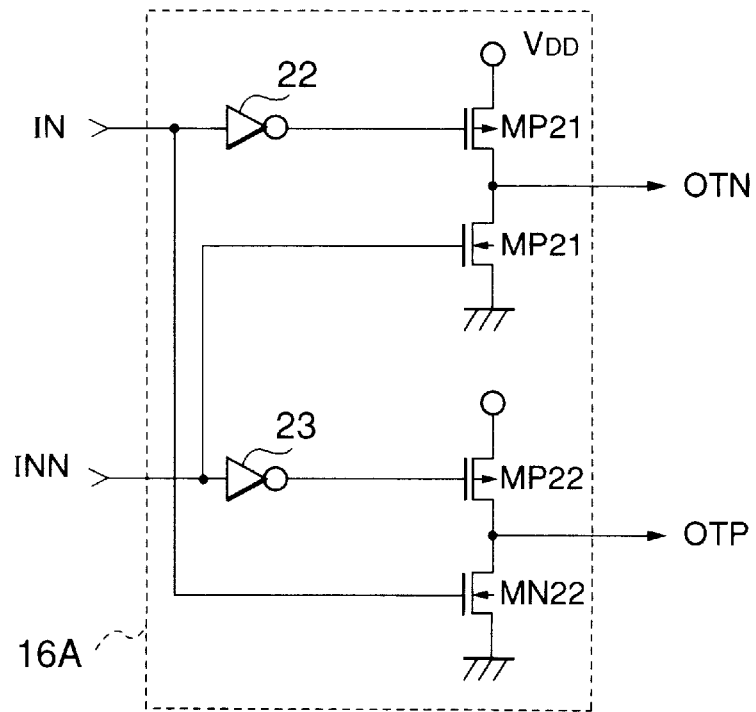
Figure 10A:
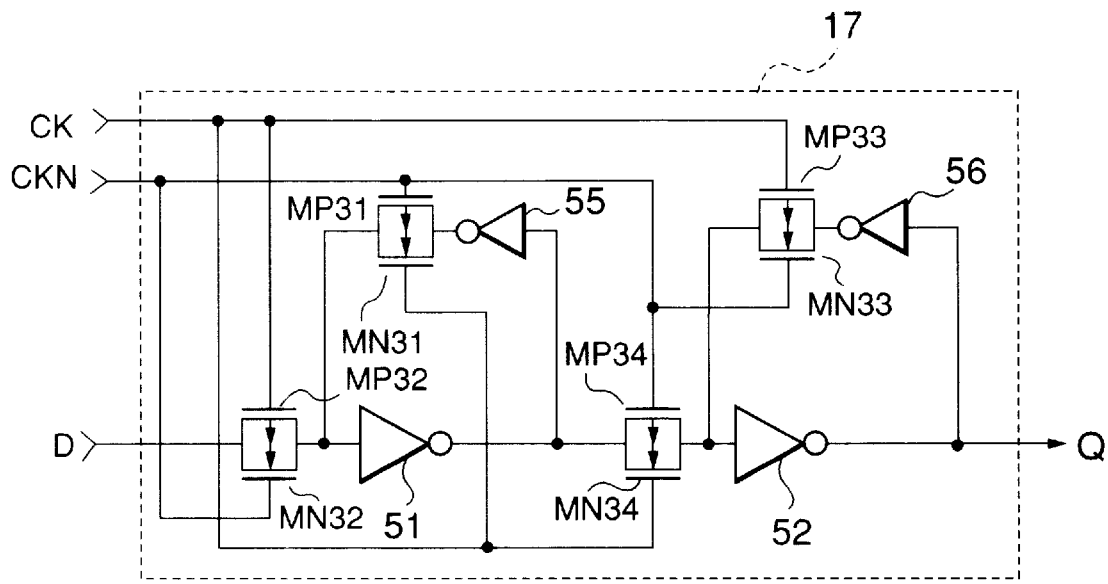
FIG. 10 shows circuit diagrams illustrating two examples of the conventional DFF17.
Figure 10B:
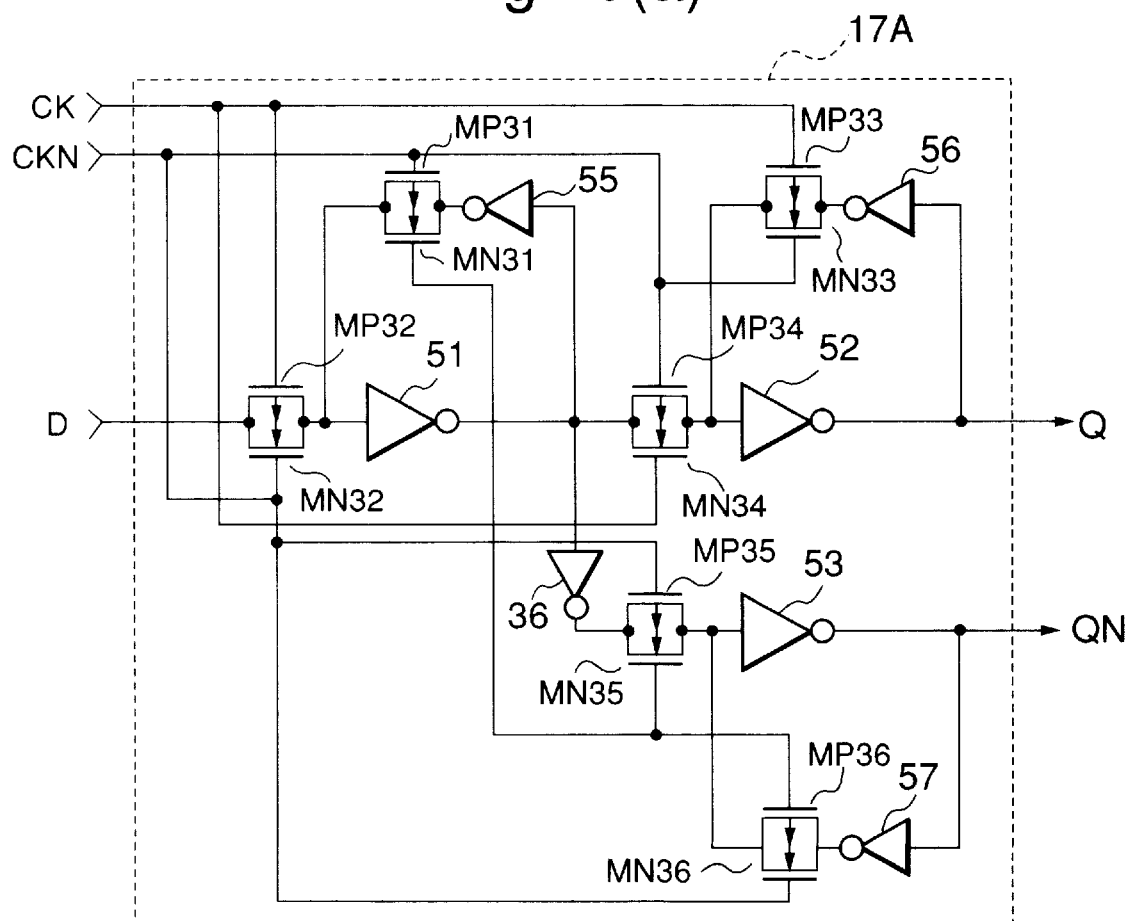
Figure 11A:
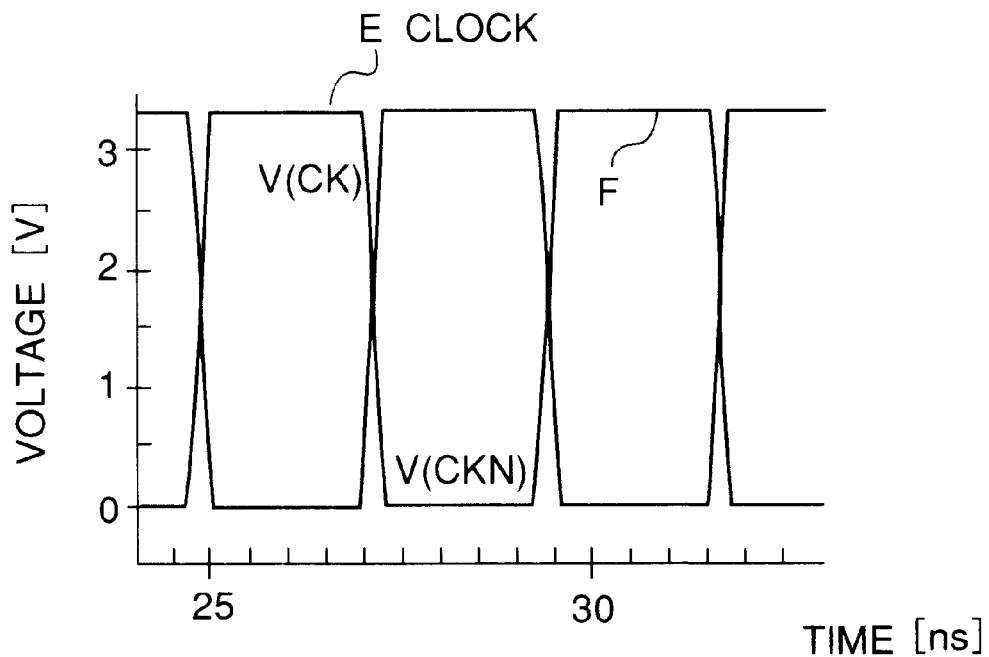
FIG. 11 shows input waveform diagrams of clocks (CK and CKN) and data (DATA) input to these circuits.
Figure 11B:
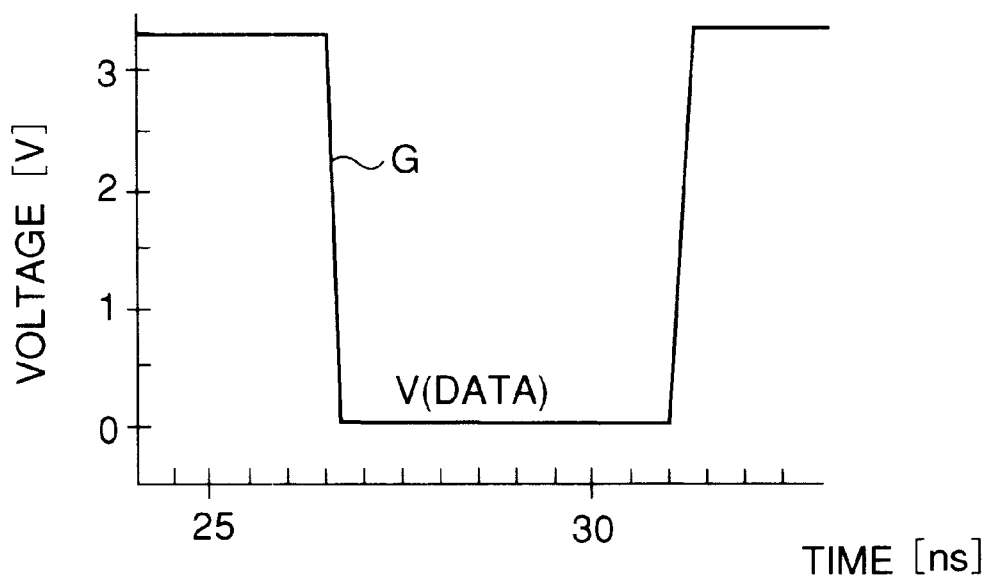

The result of the verification of transient analysis conducted by connecting the circuit of this embodiment in the manner as shown in FIG. 8(a) will be described. Here, the sizes of the transistors are set to be the same as in the prior art, the power supply voltage and the ground potential are taken to be 3.3 and 0 V, respectively. The size of the p- and n-channel MOS transistors MP1 and MN1 is taken to be the same as the transistor size of the reference size inverter 21, and similarly, the size of the transistors MP2 and MN2 in the second pseudo inverter 14 is taken to be the same as the transistor size of the three-fold inverter 41 (the channel widths of the transistors MP2 and MN2 are 20 and 8 $\mu$m. respectively). In addition, the clocks and data inputs are set to be the same as in FIGS. 11(a) and 11(b).

Figure 4A:
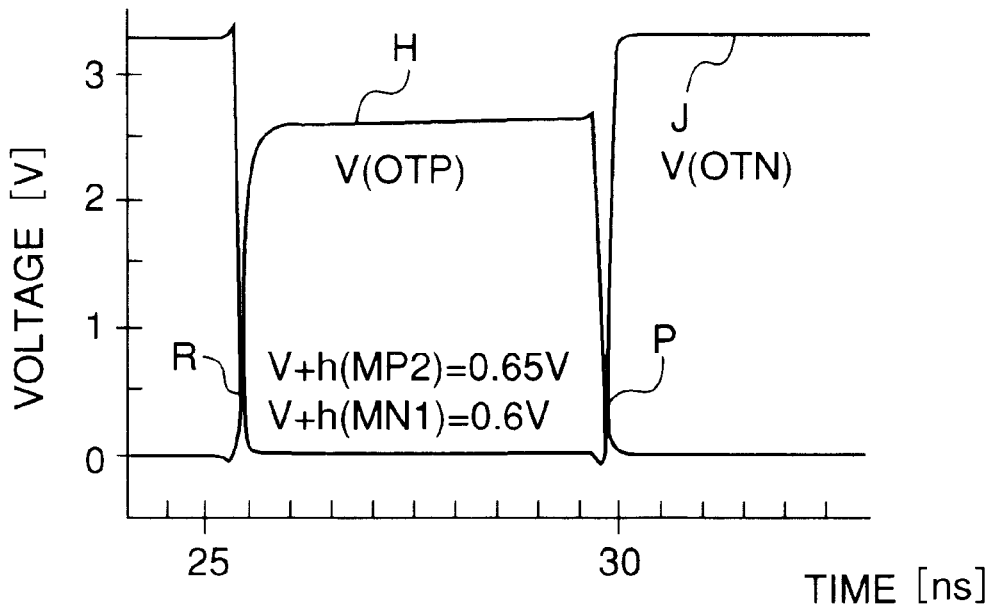
FIG. 4 shows output waveform diagrams for the cases where the threshold of the transistor MP2 in the circuit of FIG. 1 is larger and smaller than the threshold of the transistor MN1.
Figure 4B:
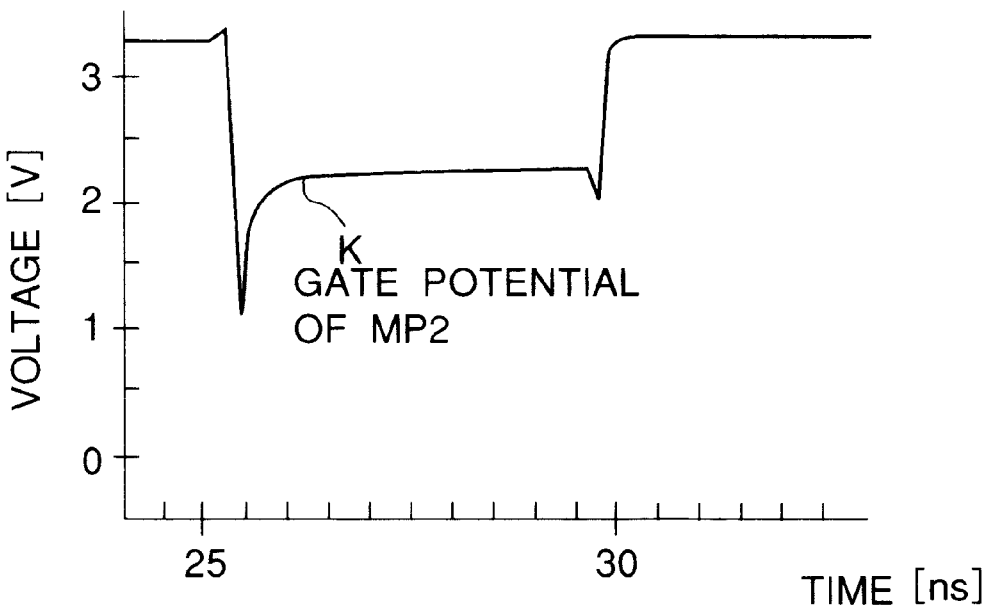

In this verification of the transient analysis, test was conducted by connecting the back gate of the transistor MN1 of the first pseudo inverter 13 to the source electrode in order to preclude the back gate effect of the transistor MN1. FIGS. 4(a) and 4(b) show the output waveform of the positive and negative phase outputs OTP and OTN of the differential signal generating circuit 16 in this case. The thresholds of the transistors MP2 and MN1 obtained from the result of the analysis are 0.65 and 0.6 V, respectively, so that it turns out that Vth[MP2] is larger than Vth[MN1]. In this case, the waveform J of the negative phase output OTN is a full swing between the power supply voltage 3.3 V and the ground potential 0 V because it is the output of the normal inverter 41.

In contrast, it can be seen that in the positive phase output waveform H the high level climbs only up to around 3.3−0.65=2.65 V. Moreover, the intersections P and R of both voltage waveforms are small values of 0.4 and 0.6 V, respectively. Consequently, the defect of the prior art, namely, the simultaneous deenergization of the transistors MP4 and MP5 of the differential switch 18 is improved. Furthermore, since the signal amplitudes of the differential input to the gates of the transistors MP4 and MP5 are small, the noise level of radiation due to variation in the gate potential leaked to the current output terminals IO and ION can be suppressed. Since this is valid on the condition that Vth[MP2] is larger than Vth[MN1], it is necessary to pay attention to the values of the threshold.

In the circuit actually used, however, it often happens that Vth[MP2] is smaller than Vth[MN1] because of the rise in the threshold value owing to the back gate of the transistor MN1. This is realized by connecting the back gate of the transistor MN1 to the ground potential. The change in the gate potential of the transistor MP2 in the verification of transient analysis is shown in FIG. 4(b), and from this data it is found that the thresholds of the transistors MP2 and MN1 are 0.65 and 1.0 V, respectively. The gate electrode potential of the MP2 in this case is considered to be equal to the power supply voltage 3.3 V when the positive phase input IN is at low level, and VDD−Vth[MN1]=3.3−1.0=2.3 V, the value where the transistor MN1 is deenergized, when the IN is at high level. This agrees well with the result shown in FIG. 4(b).

Figure 5A:
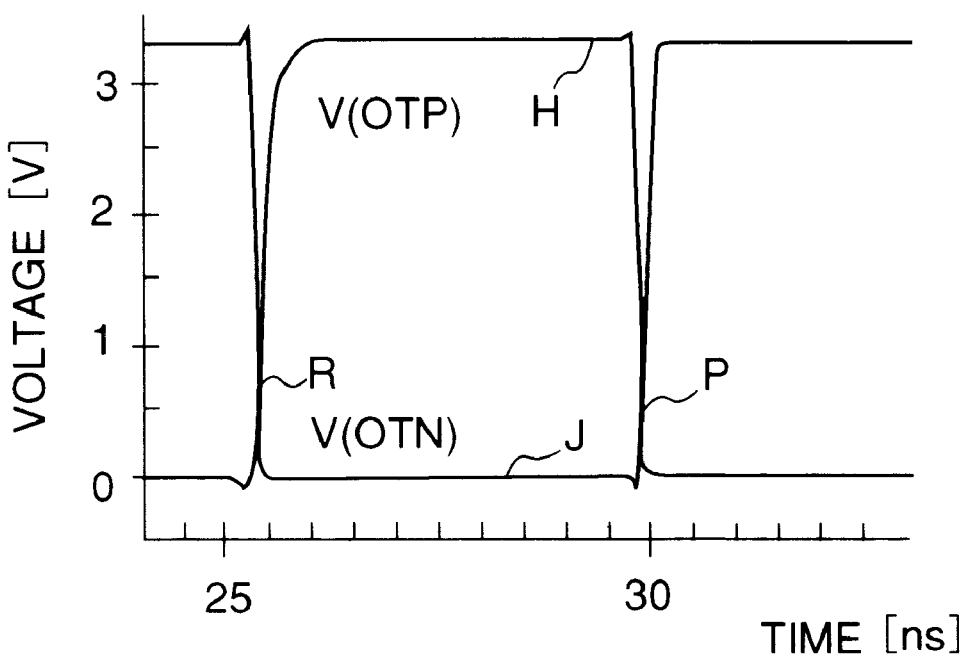
FIG. 5 shows output waveform diagrams of the case where the threshold of the transistor MP2 in the circuits of FIG. 1
Figure 6A:
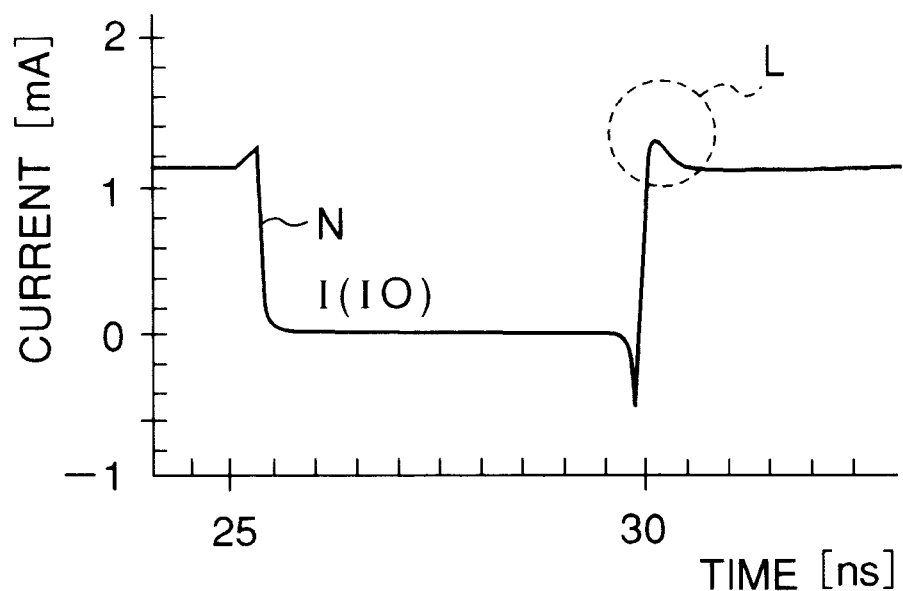
FIG. 6 shows current waveform diagrams of the case where a differential switch 18 is operated in FIGS. 5(a) and 5(b)
Figure 12A:
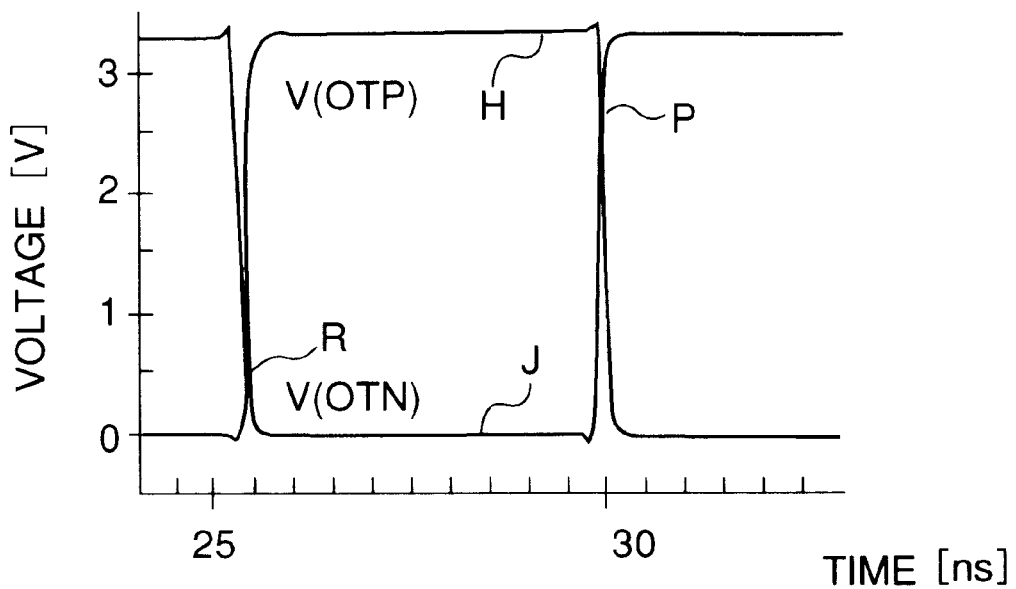
FIG. 12 shows output waveform diagrams when the differential signal generating circuits 16 of FIG. 9 are operated by changing the conditions of the inverters.
Figure 12B:
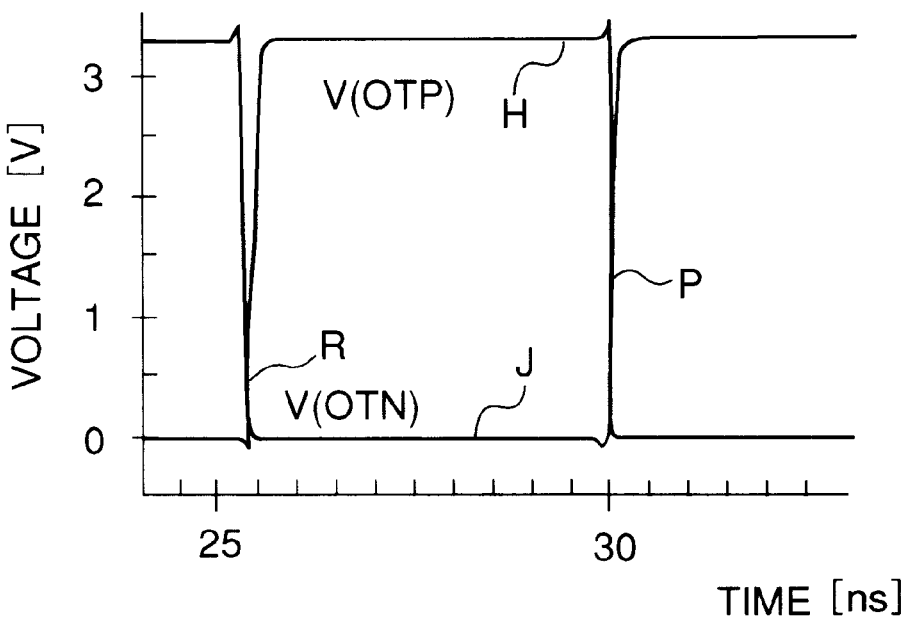
Figure 13A:
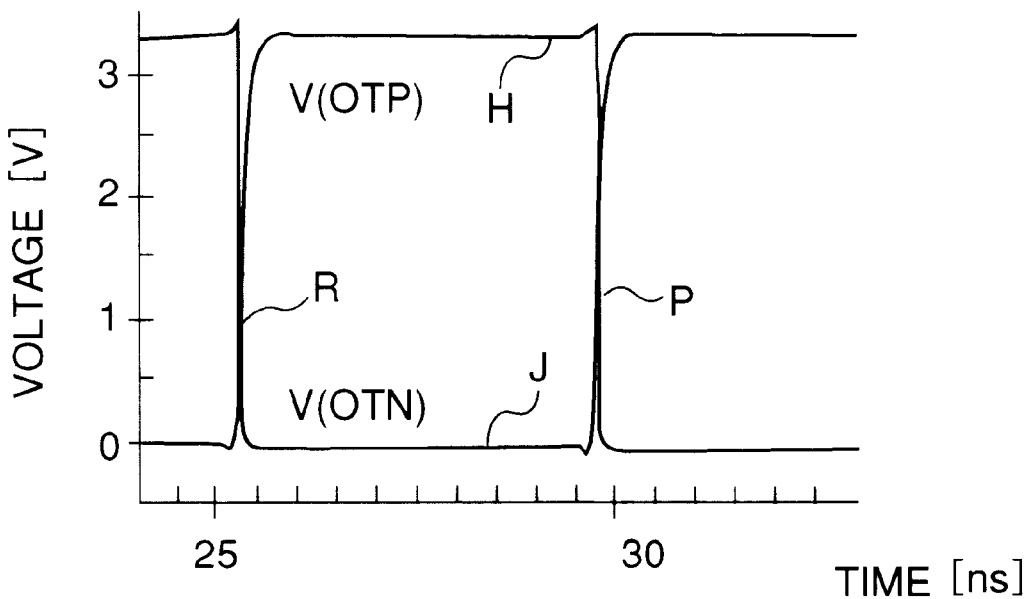
FIG. 13 shows output waveform diagrams illustrating the operation of the differential signal generating circuits in FIGS. 9(a) and 9(b)
Figure 13B:
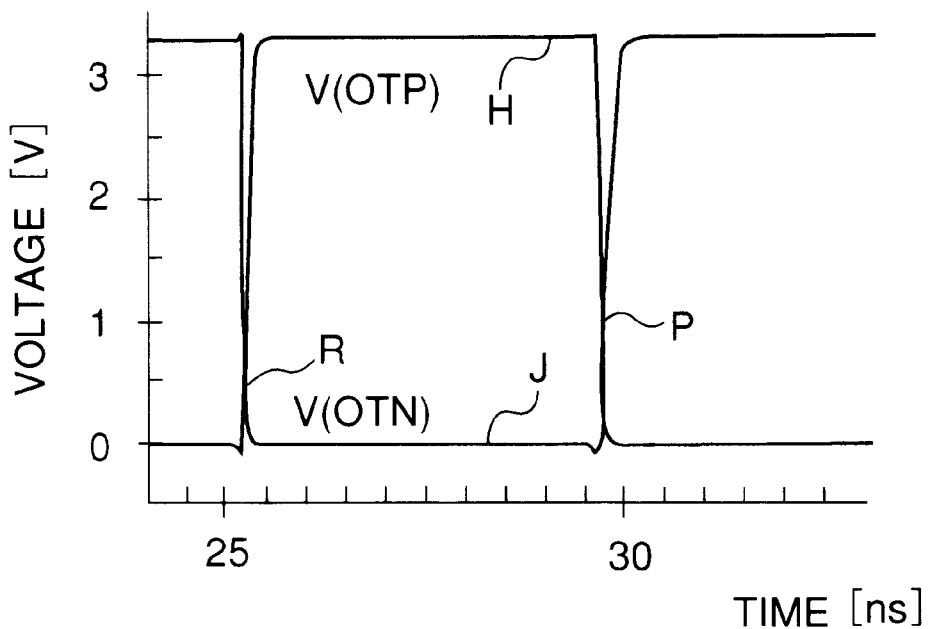
Figure 14A:
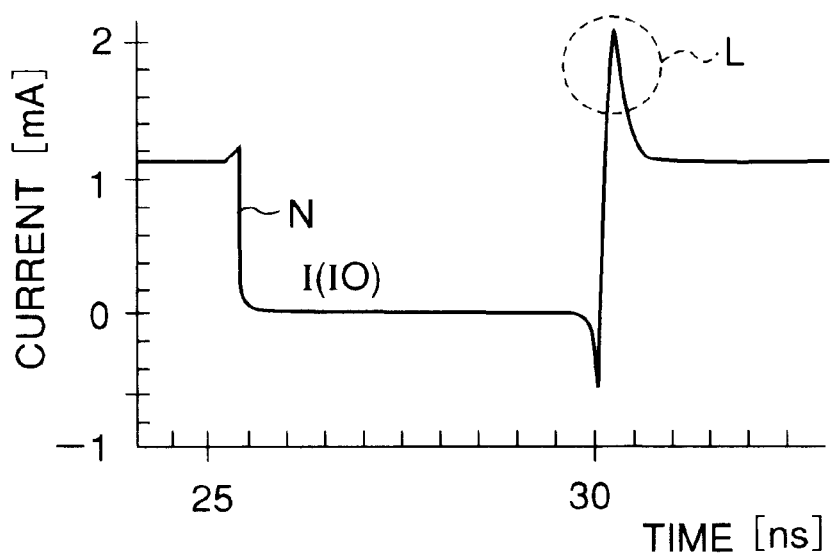
FIG. 14 shows current waveform diagrams at the output terminal when the differential switch 18 is operated for the cases in FIGS. 12(a) and 12(b)
Figure 14B:
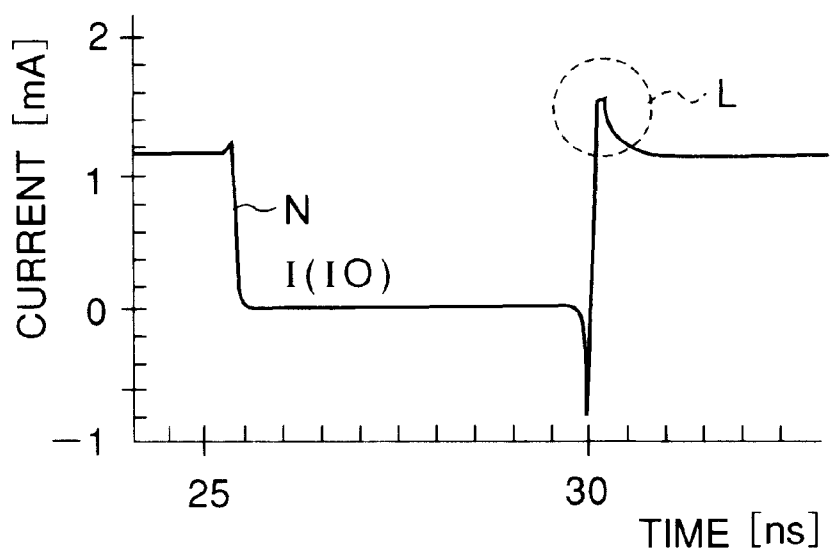
Figure 15A:
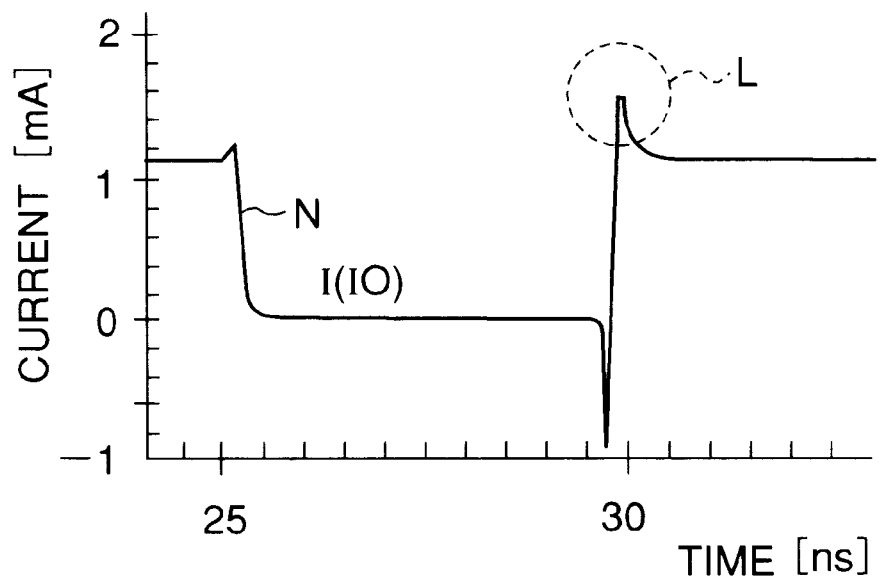
FIG. 15 shows current waveform diagrams at the output terminal when the differential switch 18 is operated for the cases in FIGS. 13(a) and 13(b)
Figure 15B:
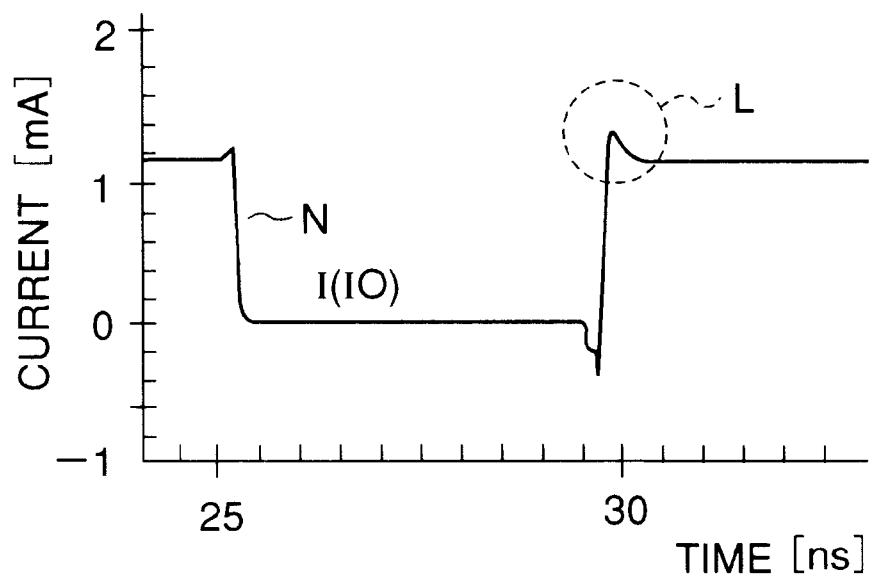

In FIG. 5(a) are shown the positive and negative phase output waveforms H and J, respectively, of the differential signal generating circuit 16. From the figure it can be seen that the positive phase output waveform H swings fully between the ground potential and the power supply voltage, and that the voltage waveform intersections P and R are around 0.4 and 0.6 V, respectively. The waveform L of the current spike at the current output terminal IO is less than half the current waveform spikes (FIGS. 12(a) and 12(b)) of the prior art, as shown in FIG. 6(a).

Figure 7A:
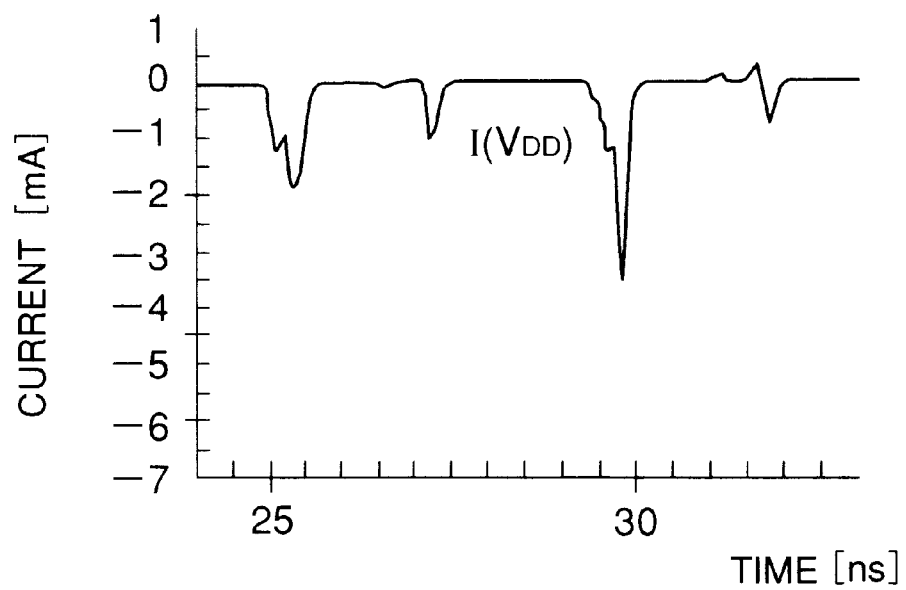
FIG. 7 shows waveform diagrams of current consumed in the blocks 16 and 17 when the differential switch 18 is operated in FIGS. 5(a) and 5(b)
Figure 16A:
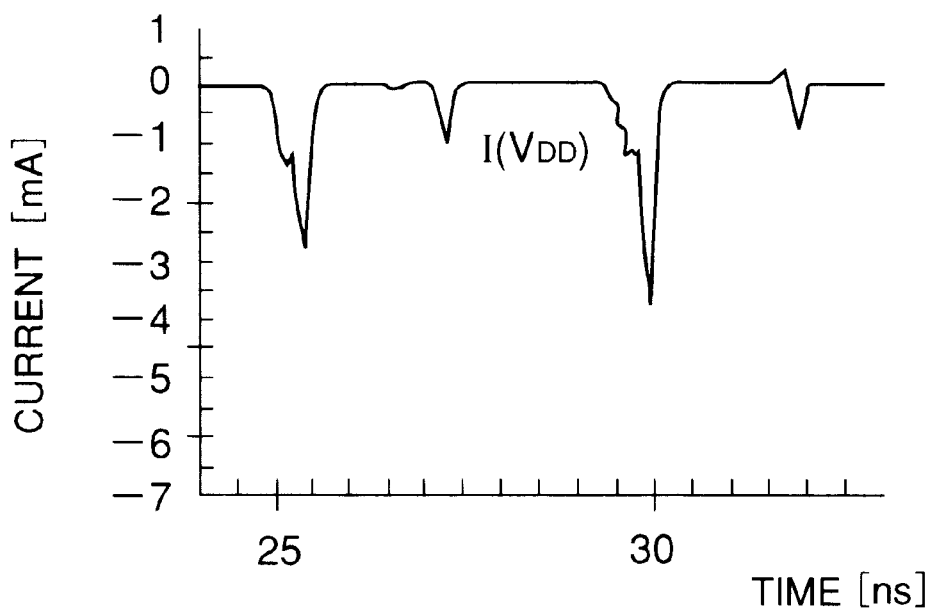
FIG. 16 shows waveform diagrams of current consumed by the blocks 16 and 17 when the differential switch 18 is operated for the cases in FIGS. 13(a) and 13(b).
Figure 16B:
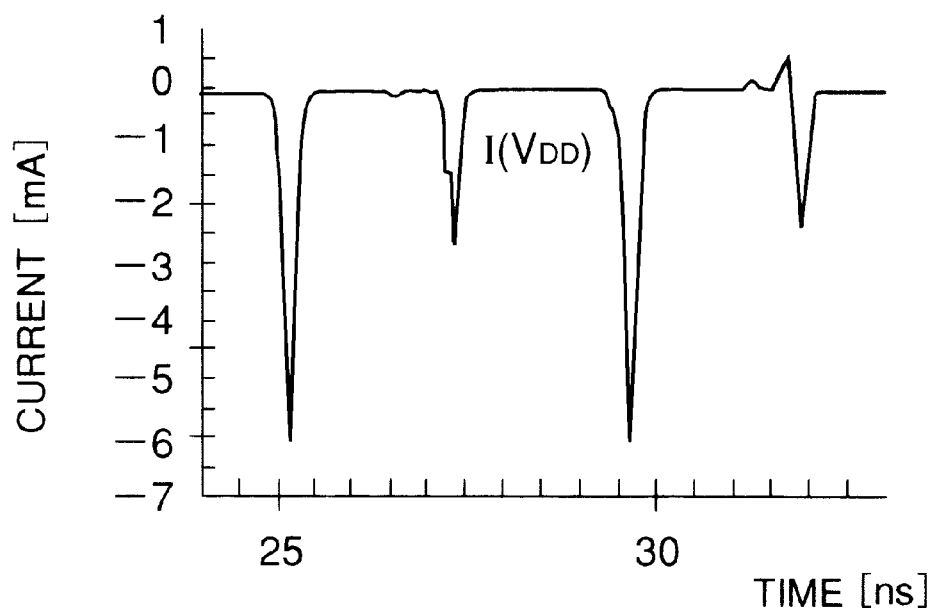

In FIG. 7(a) is shown the current consumption including the DFF17 and the differential signal generating circuit 16. A comparison of this result with the prior case of the minimum current consumption in FIG. 16(a) shows an improvement which the peak current is 3.54 mA in this embodiment against 3.96 mA in the prior art, and the mean current is 207 $\mu$A in this embodiment against 238 $\mu$A in the prior art. Furthermore, a comparison of the current consumption waveform of this embodiment with the prior case in FIG. 16(b) where the spike current is small shows that this embodiment gives an improvement of about 60% over the prior art for both the peak current and the mean current.

Figure 2:
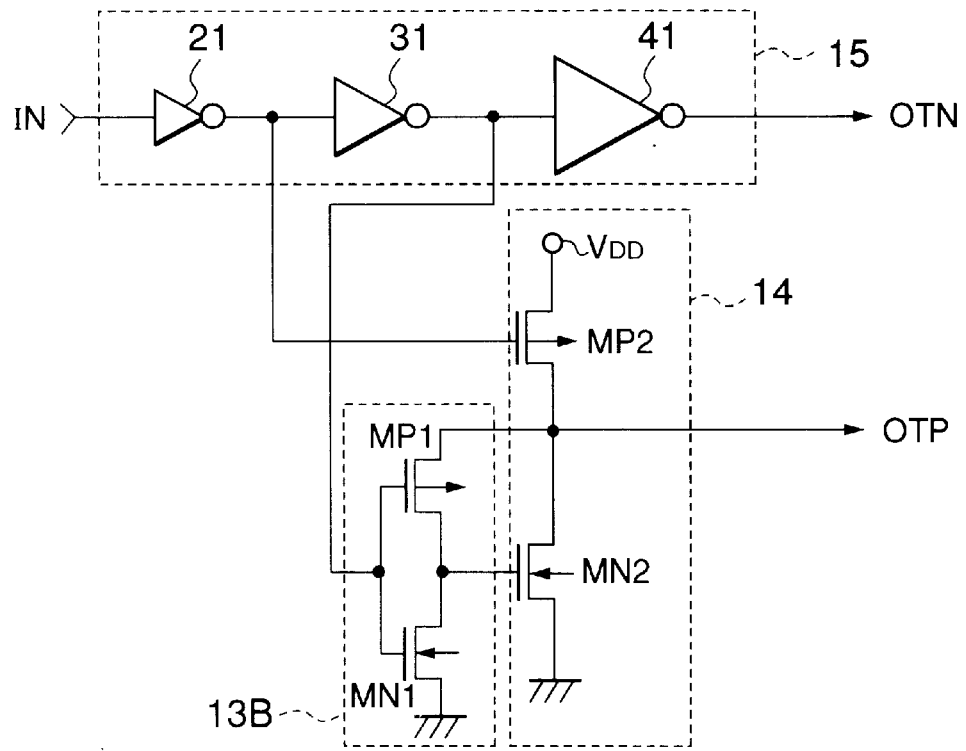
FIG. 2 is a circuit diagram illustrating a second embodiment of the invention.

FIG. 2 shows a circuit diagram of a second embodiment of this invention. Contrary to the circuit in FIG. 1, this is a differential signal generating circuit 16 formed on an n-type semiconductor substrate in which the fall time and the rise time of the positive phase output OTP are made longer and shorter, respectively, than those of the output OTN.

In this circuit, the gate electrode of the transistor MP2 of the second pseudo inverter 14 is connected to the output of the inverter 21, the gate electrode of the transistor MN2 of the second pseudo inverter 14 is connected to the output of a first pseudo inverter 13B, and the source electrodes of the transistors MP1 and MN1 of the first pseudo inverter 13B are connected to the positive phase output OTP and the ground terminal, respectively. The remaining connections of the input, and the transistors MP1 and MN1, of the first pseudo inverter 13B, as well as of the inverters 21, 31, and 41 are the same as in the first embodiment.

Figure 3:
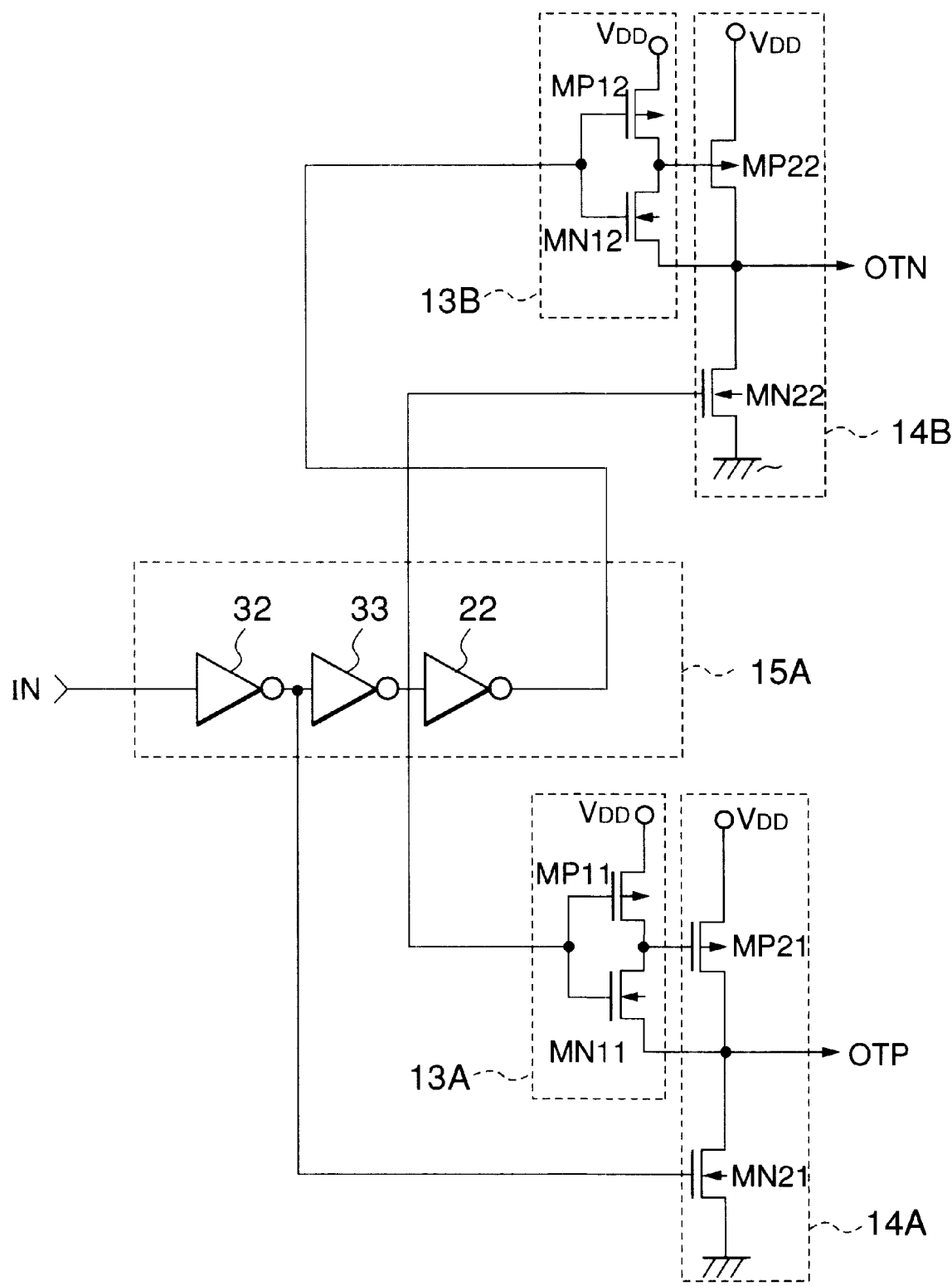
FIG. 3 is a circuit diagram illustrating a third embodiment of the invention.

FIG. 3 is a circuit diagram of a third embodiment of this invention. This circuit shows the case in which the differential signal generating circuit 16 is configured by using two sets each of the pseudo inverters 13 and 14 in FIG. 1, and that the condition in which the rise time of the positive phase output OTP alone is made longer than that of the output (it was actually the OTN in FIG. 1) of the inverter circuit group 15 in FIG. 1, is made also applicable to the negative phase output OTN. By the use of this circuit it is possible to eliminate the heavy through current which flows in the inverter 41 in FIG. 1, and diminish the peak current as well. This circuit thus comprises the five blocks of an inverter circuit group 15A which receives a positive phase input IN, and four of a first to a fourth pseudo inverters 13A, 14A, 13B and 14B.

The inverter circuit group 15A is formed by connecting inverters 32, 33, and 22 in series. The inverter 32 is supplied with the positive phase input IN as an input and its output is connected to the input of the pseudo inverter 13A, the output of the inverter 33 is connected to the input of the pseudo inverter 13B and the gate electrode of a transistor MN21 of the pseudo inverter 14A, and the output of the inverter 22 is connected to the gate electrode of a transistor MN22 of the pseudo inverter 14B. The circuits of the first and third pseudo inverters 13A and 13B are the same as that of the pseudo inverter 13 in FIG. 1, and similarly the circuits of the second and fourth pseudo inverters 14A and 14B are the same as that of the pseudo inverter 14 in FIG. 1.

Further, the output of the first pseudo inverter 13A is connected to one of the inputs of the second pseudo inverter 14A, and the output of the pseudo inverter 14A is identified as the positive phase output OTP. Analogously, the output of the third pseudo inverter 13B is connected to one of the inputs of the fourth pseudo inverter 14B, and the output of the pseudo inverter 14B is identified as the negative phase output OTN. The operation of this circuit can be described in the same way as in the operation of the first embodiment of this invention.

Next, the result of the verification of transient analysis of this circuit will be described. In this case, the sizes of the inverters 32, 33, and 22 are set to be twofold, twofold, and onefold of the size of the minimum inverter the sizes of the first to fourth pseudo inverters 13A, 13B, 14A, and 14B are set to be the same as those of the pseudo inverters 13 and 14, and the other elements with the same symbols as in the first embodiment are given the same sizes as before.

Figure 5B:
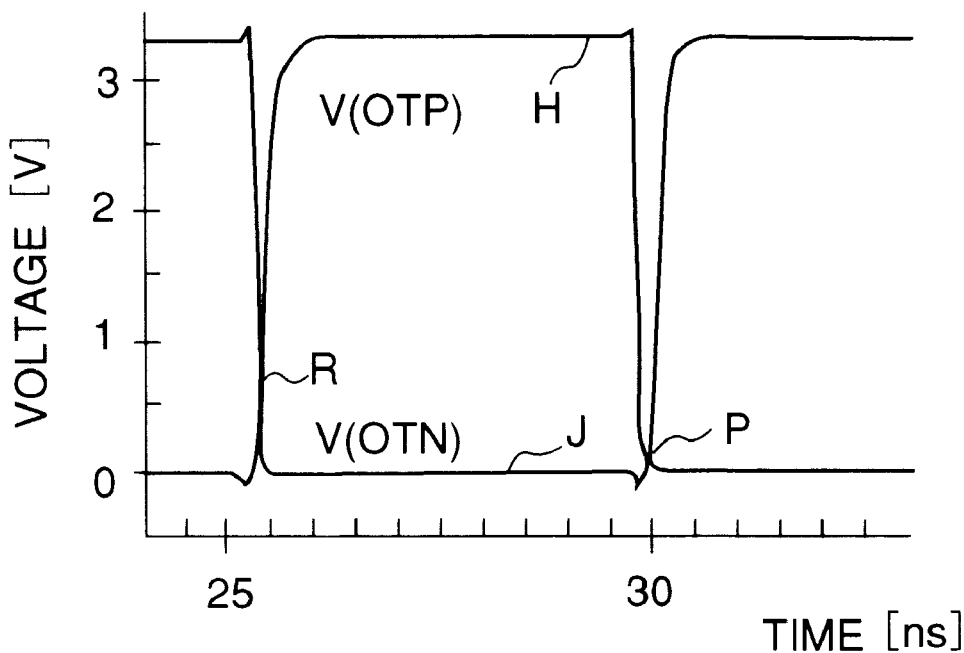
Figure 6B:
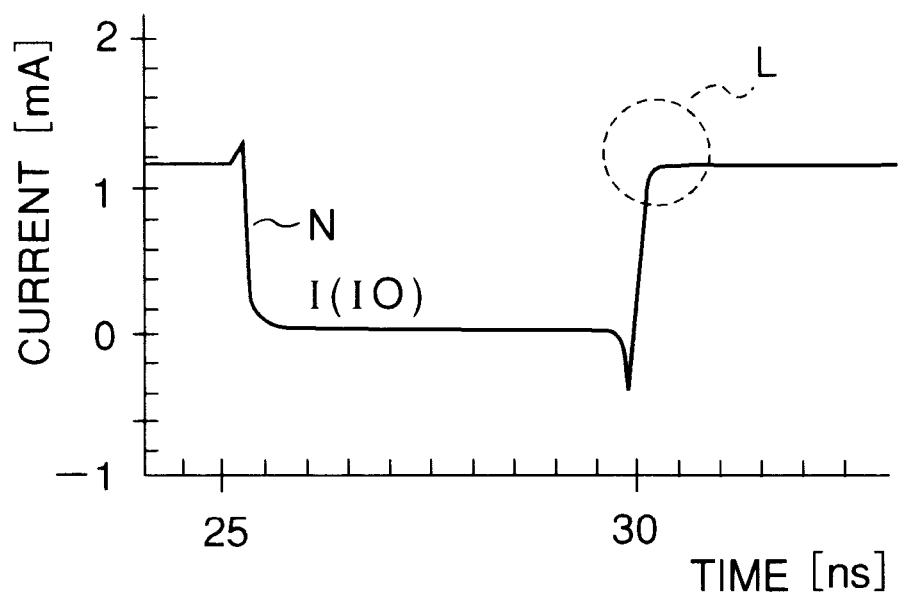
Figure 7B:
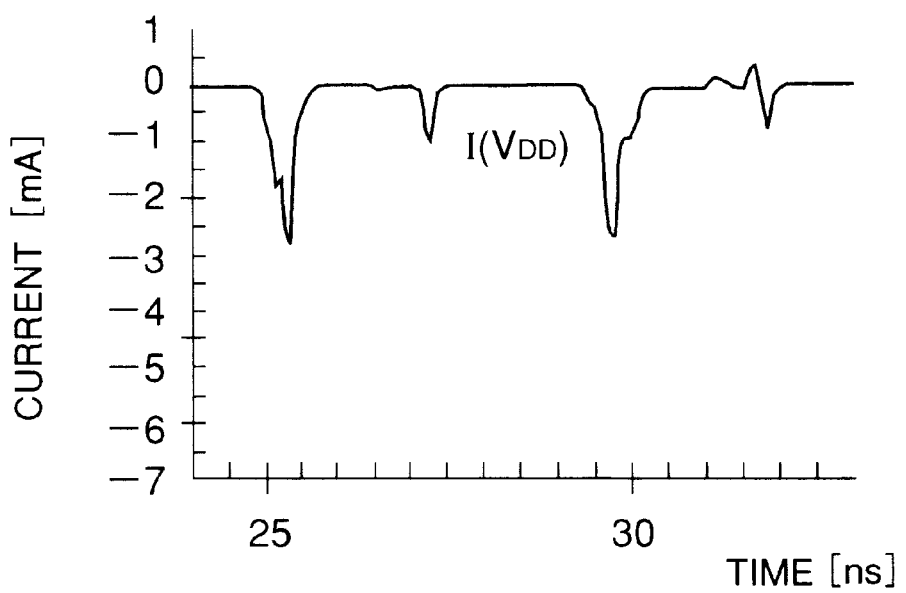

The positive phase output waveform H and the negative phase output waveform J, the current spike waveform L at the current output terminal IO, and the current consumption waveform, of this differential signal generating circuit 16 obtained by transient analysis are shown in FIG. 5(b), FIG. 6(b), and FIG. 7(b), respectively. The height of the voltage waveform intersection P was reduced from that in the case of the first embodiment to about 0.1 V, as in FIG. 5(b), and the current spike waveform L had a minimum height, as in FIG. 6(b). Further, the mean current of the current consumption waveform was raised somewhat to 224 $\mu$A compared with the first embodiment corresponding to the increase in the number of elements, but the peak current showed the minimum value of 2.79 mA, as in FIG. 7(b), indicating an improvement in the peak current.

According to the result of the verification of transient analysis, it was found that a current switching with 4.5 ns is feasible, so that a maximum operating frequency by CMOS configuration of 220 MHz is achievable. In addition, where the differential signal generating circuit of this invention is applied to a current output type D/A converter, it is possible to reduce the current consumption of the digital circuit part by a maximum of about 40% compared with the prior art.

Moreover, these embodiments can be applied, in addition to a differential amplifier circuit and a differential switching circuit, to a clock driver or the like which requires positive and negative phase outputs.

As described in the above, the differential signal generating circuit of this invention permits a constitution with smaller number of elements, enables to minimize the mean current consumption, and reduces the current spike from the current output terminal, so that the circuit makes it possible to realize a high speed current switching operation.

Furthermore, when the threshold of the n-channel MOS transistor is made smaller than the threshold of the p-channel MOS transistor, it is possible to reduce the signal amplitude of the input signal of the differential switch by the amount corresponding to the threshold of the p-channel MOS transistor from the power supply voltage, and to suppress the noise which leaks to the current output terminal via the overlap capacitance between the gate and drain of the p-channel MOS transistor of the differential switch.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications, and equivalents as can be included within the spirit and scope of the following claims.

What is claimed is:

1. A differential signal generating circuit comprising an inverter circuit inverting a control signal and outputting the inverted signal as one of differential signals, and a pseudo inverter carrying out a first and second pseudo inversions by receiving said control signal and outputting the other non-inverted differential signal by carrying out said second pseudo inversion by receiving an inverted control signal obtained by inverting said control signal, wherein said pseudo inverter employs a first p-channel and a first n-channel MOS transistors, with their gates connected in common serving as the input terminal and their drains connected in common serving as the output terminal, for said first pseudo inversion, and employs a second p-channel and a second n-channel MOS transistors, with their gates connected in common serving as the input terminal and serving as well for connection to the output of said first pseudo inversion, and their drains connected in common serving as the output terminal, for said second pseudo inversion, wherein the circuit for said pseudo inverter is formed by connecting the sources of said respective p-channel MOS transistors to a power supply terminal, grounding the source of said second n-channel MOS transistor, and connecting the source of said first n-channel MOS transistor to the commonly connected drain of said second p-channel and n-channel MOS transistors.

2. The differential signal generating circuit as claimed in claim 1, wherein said circuit includes a first, second, and third inverter circuits connected in series for inverting and outputting the control signal sequentially, and a pseudo inverter using the output of said first inverter circuit as the input to the second pseudo inversion, and using the output of said second inverter circuit as the input to said first pseudo inversion, where the output of said third inverter circuit is used as one of differential signals.

3. A differential signal generating circuit comprising an inverter circuit inverting a control signal and outputting the inverted signal as one of differential signals, and a pseudo inverter carrying out a first and second pseudo inversions by receiving said control signal and outputting the other non-inverted differential signal by carrying out said second pseudo inversion by receiving an inverted control signal obtained by inverting said control signal, wherein said pseudo inverter employs a first p-channel and a first n-channel MOS transistors, with their gates connected in common serving as the input terminal and their drains connected in common serving as the output terminal, for said first pseudo inversion, and employs a second p-channel and a second n-channel MOS transistors, with their gates connected in common serving as the input terminal and serving as well for connection to the output of said first pseudo inversion, and their drains connected in common serving as the output terminal, for said second pseudo inversion, wherein the circuit for said pseudo inverter is formed by grounding the sources of said respective n-channel MOS transistors, connecting the source of said second p-channel MOS transistor to the power supply terminal, and connecting the source of said first p-channel MOS transistor to the commonly connected drain of said second p-channel and n-channel MOS transistors.

4. The differential signal generating circuit as claimed in claim 3, wherein said circuit includes a first, second, and third inverter circuits connected in series for inverting and outputting the control signal sequentially, and a pseudo inverter using the output of said first inverter circuit as the input to the second pseudo inversion, and using the output of said second inverter circuit as the input to said first pseudo inversion, where the output of said third inverter circuit is used as one of differential signals.

5. A differential signal generating circuit comprising an inverter circuit inverting a control signal and outputting the inverted signal as one of differential signals, and a pseudo inverter carrying out a first and second pseudo inversions by receiving said control signal and outputting the other non-inverted differential signal by carrying out said second pseudo inversion by receiving an inverted control signal obtained by inverting said control signal, wherein said pseudo inverter employs a first p-channel and a first n-channel MOS transistors, with their gates connected in common serving as the input terminal and their drains connected in common serving as the output terminal, for said first pseudo inversion, and employs a second p-channel and a second n-channel MOS transistors, with their gates connected in common serving as the input terminal and serving as well for connection to the output of said first pseudo inversion, and their drains connected in common serving as the output terminal, for said second pseudo inversion, wherein said pseudo inverter includes an inverter circuit outputting the control signal by inverting it, a first pseudo inverter carrying out the first and second pseudo inversions by receiving said control signal and outputting one inverted differential signal by carrying out said second pseudo inversion by receiving an inverted control signal obtained by inverting said control signal, and a second pseudo inverter carrying out the first and second pseudo inversions by receiving an inverted control signal of said control signal and outputting the other noninverted differential signal by carrying out said second pseudo inversion by receiving said control signal.

6. The differential signal generating circuit as claimed in claim 5, wherein said circuit includes a first, second, and third inverter circuits connected in series for inverting and outputting the control signal sequentially, a first pseudo inverter using the output of said second inverter circuit as the input to the first pseudo inversion and using the output of said third inverter circuit as the input to the second pseudo inversion, and a second pseudo inverter using the output of said first inverter circuit as the input to the first pseudo inversion and using the output of said second inverter circuit as the input to the second pseudo inversion.

7. A circuit comprising:
a first power supply line;
a second power supply line;
a first output terminal;
a first transistor of a first conductivity type connected between said first power supply line and said first output terminal and a gate connected to a first node;
a second transistor of a second conductivity type opposite to said first conductivity type connected between said output terminal and said second power supply line and a gate connected to a second node; and
a first delay circuit connected between said first node and said second node,
wherein said first delay circuit comprises a first inverter connected between said second node and a third node, a third transistor of said first conductivity type connected between said first power supply line and said first node and a gate connected to said third node and a fourth transistor of said second conductivity type connected between said first node and said first output terminal and a gate connected to said third node.

8. The circuit as claimed in claim 7 further comprising, a second output terminal; a fifth transistor of said first conductivity type connected between said first power supply line and said second output terminal and a gate connected to a fourth node; a sixth transistor of said second conductivity type connected between said output terminal and said second power supply line and a gate connected to said third node; and a second delay circuit connected between said fourth node and said third node.

9. The circuit as claimed in claim 8, wherein, said second delay circuit comprises a seventh transistor of said first conductivity type connected between said first power supply line and said fourth node and gate connected to a fifth node, an eight transistor of said second conductivity type connected between said fourth node and said second output terminal, and a second inverter connected between said third node and said fifth node.

10. A circuit comprising:
an input node;
a first output terminal;
a second output terminal;
a first inverter connected between said input node and a first node;
a second inverter connected between said first node and a first output terminal;
a first transistor of a first conductivity type connected between a first power supply line and said second output terminal and having a gate connected to a second node;

a second transistor of a second conductivity type connected between a second power supply line and said second output terminal and having a gate connected to said input node; and a delay circuit connected between said first node and said second node.

11. The circuit as claimed in claim 10, wherein said delay circuit includes a third transistor of said first conductivity type connected between said first power supply line and said second node and having a gate connected to said first node, and a fourth transistor of said second conductivity type connected between said second output terminal and said second node and having a gate connected to said first node.

* * * * *